United States Patent [19]

Han et al.

[11] Patent Number: 5,763,908
[45] Date of Patent: Jun. 9, 1998

[54] SEMICONDUCTOR MEMORY DEVICE HAVING AN INTERCONNECT STRUCTURE WHICH IMPROVES YIELD

[75] Inventors: Eui-Gyn Han, Kyungki-do; Kwang-suk Ryu, Seoul; Ki-won Lim, Kyungki-do, all of Rep. of Korea

[73] Assignee: Samsung Electronics Co., Ltd., Suwon, Rep. of Korea

[21] Appl. No.: 687,925

[22] Filed: Jul. 29, 1996

[30] Foreign Application Priority Data

Jul. 28, 1995 [KP] DPR of Korea ............... 95-22941

[51] Int. Cl.⁶ .................................................. H01L 27/10
[52] U.S. Cl. ...................... 257/208; 257/210; 257/202; 365/227
[58] Field of Search .................... 365/227, 244; 257/203, 207, 208, 210, 211, 202

[56] References Cited

U.S. PATENT DOCUMENTS 5,432,730  7/1995  Shubat et al. .................. 257/202

*Primary Examiner*—Jorome Jackson
*Assistant Examiner*—Nathan K. Kelley
*Attorney, Agent, or Firm*—William L. Geary, Jr.

[57] ABSTRACT

A semiconductor memory device in which word lines are arranged so as to improve the yield with respect to bridging defects. The semiconductor memory device of the present invention has a plurality of interconnects arranged in parallel on a cell array portion, in which the interconnects are comprised of power lines and ground lines arranged alternately on the cell array portion, main word lines arranged on each side of the power lines, and a plurality of block word lines sequentially arranged between a single main word line and a ground line adjacent thereto and controlled by the main word line. In this way, interconnects are arranged in alternating groups so that interconnects having the same logic level during the standby mode are grouped together. The result of this arrangement is that interconnect bridges within a group will not lead to increased standby current, thereby substantially improving the yield of the semiconductor memory device. In addition, the spacing between groups of interconnects may be increased, further reducing the probability of increased standby current due to a bridging defect, thereby further increasing the yield.

7 Claims, 2 Drawing Sheets

SEMICONDUCTOR MEMORY DEVICE HAVING AN INTERCONNECT STRUCTURE WHICH IMPROVES YIELD

BACKGROUND OF THE INVENTION

The present invention relates to a semiconductor memory device, and more particularly, to a semiconductor memory device in which word lines, ground lines and power lines are arranged so as to improve yield.

Semiconductor devices are highly integrated, and the intervals between and width of circuit interconnections are very narrow. Consequently, there is great interest in developing new techniques for forming fine patterns in semiconductor devices. Such improved fabrication techniques directly influence the yield of semiconductor memory devices, which typically consist of a cell array portion, a peripheral portion, and a redundant cell array portion. Failures occur in a semiconductor memory device when substandard patterns, or bridges due to conductive contaminants, occur between the adjacent interconnections. When a bridge is formed on the interconnections, for example, on word lines, power lines and ground lines of the cell array portion, at least one cell may not operate. The malfunction can be repaired by replacing the inoperative cells with the redundant cells. However, when the repaired semiconductor memory device is in a standby mode of operation, there is leakage current due to the bridge formed between interconnections in the cell array portion. Therefore, the semiconductor memory device may fail to meet its specifications because of its increased standby current.

FIG. 1 is a block diagram illustrating a decoder and a word line of a typical semiconductor memory device.

Referring to FIG. 1, reference numeral 1 denotes a row pre-decoder (X pre-decoder) for inputting address signals through a row address pad (not shown) and a row address buffer (not shown) of a semiconductor memory device, for example, a SRAM device, and then outputting the signals through only a predetermined output among a plurality of outputs. Reference numeral 3 denotes a plurality of main word lines $MWL_i$, and reference numeral 5 denotes a plurality of block word lines $BWL_i$ connected to a main word line and controlled by it. Here, a main word line of the plurality of block word lines 3 controls a plurality of block word lines 5. Typically, a main word line controls four separate block word lines.

FIG. 2 is a view illustrating a part of an arrangement of the main word lines $MWL_i$, block word lines $BWL_i$, ground lines Vss, and power lines Vcc on the cell array portion according to the conventional art.

Referring to FIG. 2, reference symbols Vss and Vcc denote a ground line and a power line, respectively, which are alternately arranged at predetermined intervals and which supply electric power to the cell array. Reference symbols $MWL_i$ denotes an ith main word line arranged halfway between power line Vcc and an adjacent ground line Vss. Reference symbol $MWL_{i+1}$ denotes an (i+1)th main word line arranged halfway between power line Vcc and another adjacent ground line Vss. Reference symbols BWL0 through BWL3 denote block word lines controlled by a single main word line ($MWL_i$ or $MWL_{i+1}$), and dividedly arranged on each side thereof. When the semiconductor memory device is in an active mode, such as a chip enable mode, and ith main word line $MWL_i$ is selected, main word line $MWL_i$ is supplied with a voltage corresponding to logic "0", the same voltage as ground line Vss, and block word lines BWL0 through BWL3, adjacent to and arranged on either side of main word line $MWL_i$, are supplied with a voltage corresponding to logic "1", the same voltage as power line Vcc. At the same time, nonselected main word line $MWL_{i+1}$ is supplied with the voltage of logic "1" and block word lines BWL0 through BWL3 adjacent to and arranged on either side of and controlled by main word line $MWL_{i+1}$ have the voltage of logic "0".

When the semiconductor memory device is in a standby mode, all of the main word lines $MWL_i$ and $MWL_{i+1}$ have a voltage corresponding to logic "1" and all of the block word lines BWL0 through BWL3 have a voltage corresponding to logic "0".

According to the conventional art, in the active mode of a semiconductor memory device, when bridges are formed on the region between two interconnections having different voltages, some of cells malfunction due to leakage current through the bridges. For example, a bridge may be formed between ground line Vss and an adjacent block word line BWL3 or BWL0, between power line Vcc and an adjacent block word line BWL3 or BWL0, or between a main word line ($MWL_i$ or $MWL_{i+1}$) and an adjacent block word line BWL1 or BWL2. As previously stated, such a malfunction problem may be overcome by a repair process in which the malfunctioning cells are replaced with redundant cells.

If the bridges are formed on certain regions in the cell array, there may be an increase in the standby current in the semiconductor memory device, even after the repair process has been completed. The increase in standby current results when a bridge is formed between interconnects having different voltage levels. For example, standby current is increased when a bridge is formed between a main word line ($MWL_i$ or $MWL_{i+1}$) and an adjacent block word line BWL1 or BWL2, or between a power line Vcc and an adjacent block word line BWL3 or BWL0. The leakage current may lead to an increase in the standby current beyond an acceptable level, thereby causing a significant reduction in the yield of the semiconductor memory device.

SUMMARY OF THE INVENTION

An object of the present invention is to provide a semiconductor memory device in which word lines, ground lines and power lines are arranged on a cell array area so as to minimize a deterioration of yield due to bridging defects among the lines.

To achieve the above object, a plurality of interconnections are arranged parallel to each other on a cell array area of a semiconductor memory device, wherein the plurality of interconnections are comprised of:

power lines and ground lines alternately arranged on the cell array portion;

main word lines arranged on each side of the power lines; and a plurality of block word lines sequentially arranged between a single main word line and a ground line adjacent thereto and controlled by the single main word line.

According to the present invention, the plurality of block word lines controlled by a main word line are sequentially arranged between the main word line and the ground line adjacent thereto, that is, on one side of the main word line. In this way, interconnections are arranged in alternating groups so that interconnections having the same logic level during the standby mode are grouped together. Therefore, interconnect bridges within a group will not lead to increased standby current, thereby substantially improving the yield of the semiconductor memory device. In addition, the spacing between groups of interconnects may be increased, further reducing the probability of increased standby current due to a bridging defect, thereby further increasing the yield.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Figure 1:
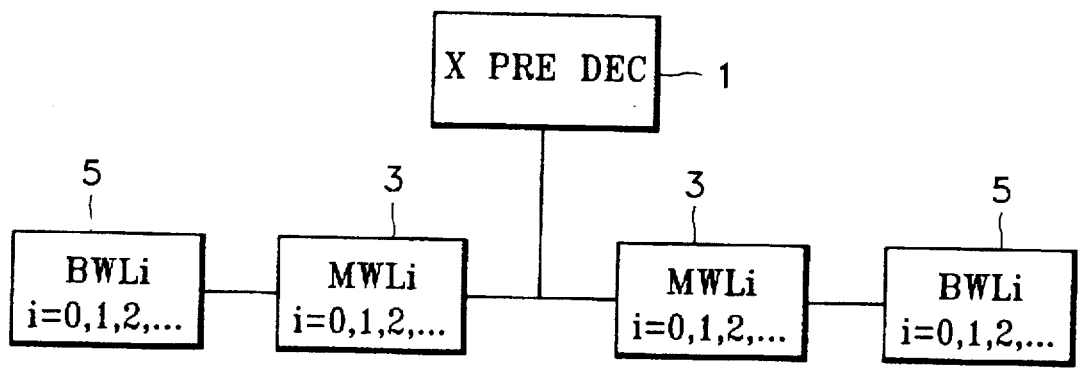
FIG. 1 is a block diagram showing a portion of a decoder and word lines of a typical semiconductor memory device.
Figure 2:
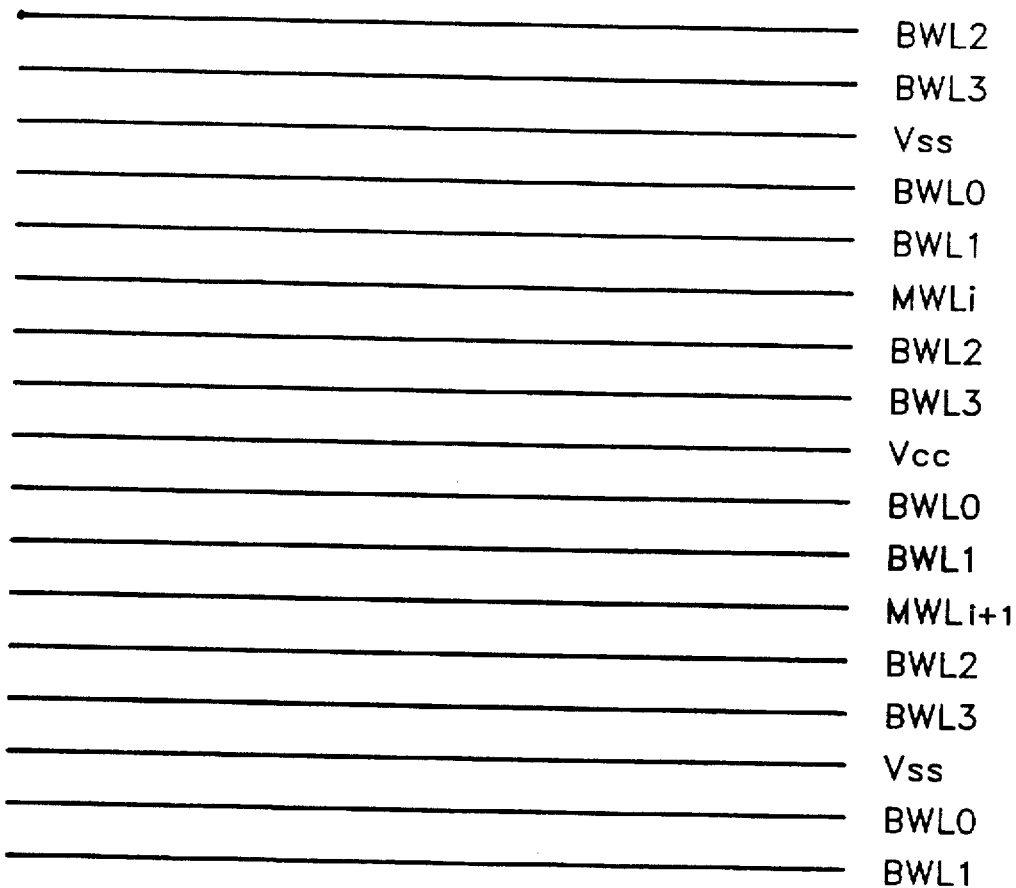
FIG. 2 is a view illustrating the arrangement of main word lines $MWL_i$, block word lines $BWL_i$, ground lines Vss, and power lines Vcc on a portion of the cell array portion according to the conventional art.
Figure 3:
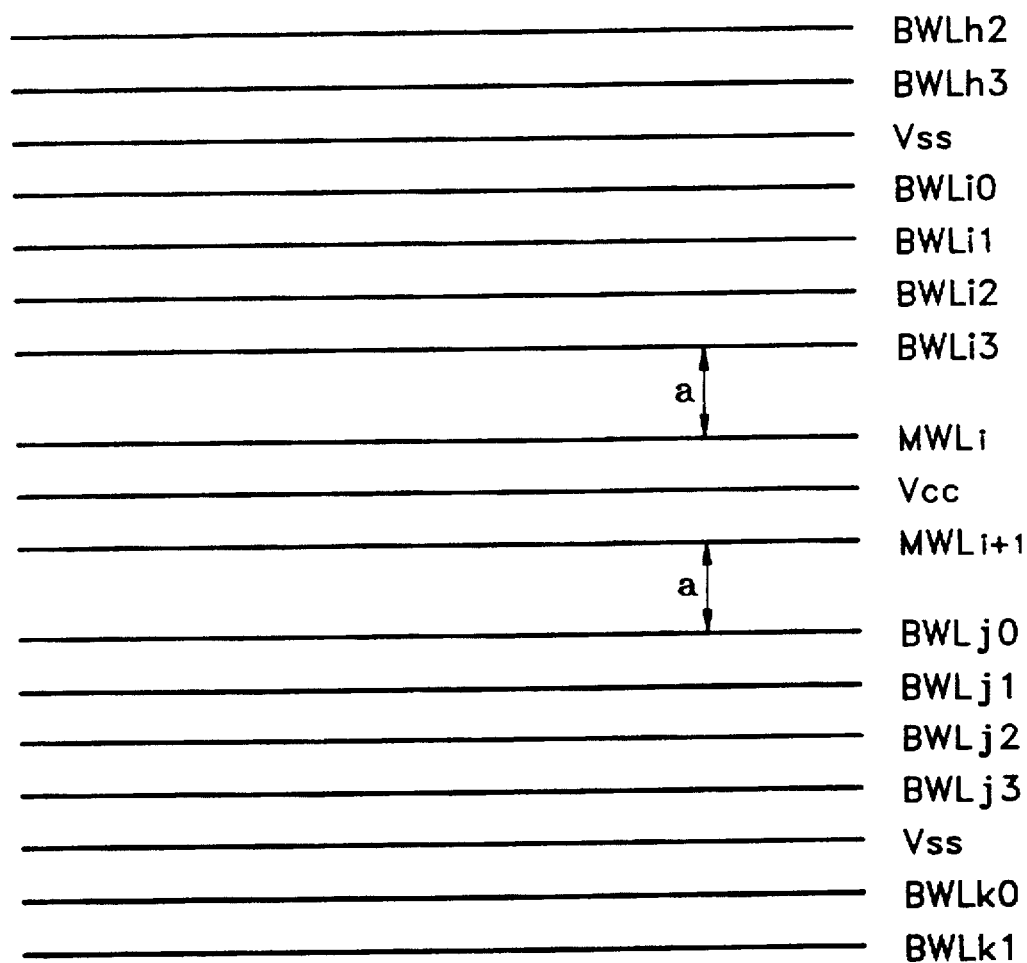
FIG. 3 is a view illustrating the arrangement of main word lines $MWL_i$, block word lines $BWL_i$, ground lines Vss, and power lines Vcc on a portion of the cell array according to the present invention.

Referring to FIG. 3, reference symbols Vcc and Vss denote a power line and a ground line, respectively, which are alternately arranged and which supply electric power to the cell. Reference symbols $MWL_i$ and $MWL_{i+1}$ denote the ith and (i+1)th main word lines, respectively, which are arranged on each side of power line Vcc at predetermined intervals. Reference symbols BWLi0 through BWLi3 denote a plurality of block word lines sequentially arranged between ith main word line $MWL_i$ and ground line Vss adjacent thereto, and controlled by ith main word line $MWL_i$. Reference symbols BWLj0 through BWLj3 denote a plurality of block word lines sequentially arranged at a predetermined interval between (i+1)th main word line $MWL_{i+1}$ and ground line Vss adjacent thereto, and controlled by the (i+1)th main word line $MWL_{i+1}$. Reference symbol "a" denotes a space between a main word line ($MWL_i$ or $MWL_{i+1}$) and the adjacent block word line (BWLi3 or BWLj0).

Also, reference symbols BWLh2 and BWLh3 denote block word lines among the plurality of block word lines sequentially arranged between the (i−1)th main word line $MWL_{i-1}$ (not shown) and the adjacent ground line Vss, and controlled by main word line $MWL_{i-1}$. Reference symbols BWLk0 and BWLk1 denote some of the block word lines among the plurality of block word lines sequentially arranged between the (i+2)th main word line $MWL_{i+2}$ (not shown) and the adjacent ground line Vss, and controlled by main word line $MWL_{i+2}$.

When the semiconductor memory device is in the active mode and ith main word line $MWL_i$ is selected, main word line $MWL_i$ has the voltage of a logic "0," and block word lines BWLi0 through BWLi3 controlled by main word line $MWL_i$ have the voltage of a logic "1". Meanwhile, all of nonselected main word lines ($MWL_{i-1}$, $MWL_{i+1}$ and $MWL_{i+2}$) have the voltage of a logic "1," and the plurality of block word lines (BWLj0 to BWLj3, BWLk0, BWLk1, BWLh2 and BWLh3) have the voltage of logic "0". Accordingly, when bridges are formed in certain areas between interconnections having different voltages, the problem of malfunctioning cells can typically be overcome by the repair process. For example, repairs typically can be made for bridges between a power line Vcc and an adjacent main word line ($MWL_i$ or $MWL_{i+1}$), between a single main word line ($MWL_i$ or $MWL_{i+1}$) and an adjacent block word line (BWLi3 or BWLj0), or between a ground line Vss and an adjacent block word line (BWLh3, BWLi0, BWLj3 or BWLk0).

When the semiconductor memory device is in the standby mode, all of main word lines ($MWL_{i-1}$, $MWL_i$, $MWL_{i+1}$ and $MWL_{i+2}$) have the voltage of logic "1" and all of block word lines (BWLi0 through BWLi3, BWLj0 through BWLj3, BWLk0, BWLk1, BWLh2 and BWLh3) have the voltage of logic "0". The spacing between adjacent groups of interconnections having different voltages is designated as "a." In other words, the interconnections are arranged in alternating groups so that interconnections having the same logic level in the standby mode are grouped together. In addition, the groups may be separated from each other by a distance "a" which is greater than the distance between interconnections within the same group. As a consequence, the increased leakage current in standby mode occurs only when bridges are formed across the space "a."

This invention reduces the probability, as compared with the prior art, of producing substandard devices due to increased leakage current resulting from the formation of bridges between two interconnections due to contaminant particles or poor patterns. Furthermore, when the space "a" is increased relative to the intervals between the other interconnections, the yield is increased further, because there is a lower probability that bridges will occur between groups, such as between a main word line and an adjacent block word line.

According to an embodiment of the present invention, a plurality of block word lines controlled by a main word line are arranged together between the single main word line and the ground line adjacent thereto, thereby remarkably reducing the probability of increased standby current due to the bridging of interconnects, and improving the yield of semiconductor memory devices. Furthermore, the yield improvement is enhanced when the interval between a main word line and an adjacent block word line is greater than the other intervals.

The present invention is not limited to the above embodiments, and many other variations, covered by the appended claims, will be apparent to those skilled in the art.

What is claimed is:

1. A semiconductor device having a plurality of operational modes, comprising:

a plurality of interconnects which are substantially parallel within a portion of a layer of said semiconductor device, wherein each interconnect may be coupled to at least one of a plurality of different voltage levels;

said interconnects being arranged in a plurality of groups of adjacent interconnects within said portion of said layer, wherein each said interconnect within a first said group of adjacent interconnects is coupled to a first voltage level of said plurality of different voltage levels during a standby mode of said plurality of operational modes; and wherein each said interconnect within a second said group of adjacent interconnects, said second group adjacent to said first group, is coupled to a second voltage level of said plurality of different voltage levels during said standby mode.

2. A semiconductor device as in claim 1, wherein each of said adjacent interconnects within a said group are separated by a first interval, and said first group and said second group are separated by a second interval.

3. A semiconductor device as in claim 2, wherein said second interval is greater than said first interval.

4. A semiconductor device as in claims 1 or 3, wherein said portion of said layer comprises a cell array portion.

5. A semiconductor device as in claim 6, wherein:

said first group of adjacent interconnects comprises a pair of main word line interconnects and a first power supply interconnect positioned between said pair of main word line interconnects, each said interconnect in said first group coupled to said first voltage level during said standby mode; and said second group of adjacent interconnects comprises a second power supply interconnect, a first group of block word lines positioned on one side of said second power supply interconnect, and a second group of block word lines positioned on the other side of said second power supply interconnect, each said interconnect in said second group coupled to said second voltage level during said standby mode.

6. A semiconductor memory device, comprising:

a plurality of interconnects arranged substantially parallel to each other on a cell array portion of said semiconductor memory device, said interconnects comprising power lines, ground lines, main word lines, and block word lines;

said power lines and said ground lines arranged in an alternating pattern on said cell array portion;

a pair of said main word lines arranged adjacent to and on either side of each said power line; and a plurality of said block word lines arranged between one of said pair of said main word lines and one of said ground lines nearest said one of said pair of main word lines, wherein said plurality of said block word lines are controlled by said main word line adjacent thereto.

7. A semiconductor memory device as in claim 6, wherein each said main word line and each said block word line adjacent thereto are separated by a first distance, and wherein said first distance is greater than each of: a second distance between adjacent said block word lines, a third distance between each said main word line and said adjacent power line, and a fourth distance between said nearest ground line and a nearest said block word line.

* * * * *